United States Patent
Straemke

[19]
[11] Patent Number: 5,826,773
[45] Date of Patent: Oct. 27, 1998

[54] ROPE MATERIAL TRANSFER STRUCTURE

[76] Inventor: Siegfried Straemke, Fichtenhain 6, 52538 Selfkant, Germany

[21] Appl. No.: 791,326

[22] Filed: Jan. 31, 1997

[51] Int. Cl.[6] ............................. B65H 23/18; C23C 16/00
[52] U.S. Cl. ............................. 226/39; 118/718; 118/733; 226/195; 242/615.3
[58] Field of Search ............................. 226/39, 38, 195, 226/199; 242/615.3; 118/718, 733

[56] References Cited

U.S. PATENT DOCUMENTS

| | | | |
|---|---|---|---|
| 3,669,065 | 6/1972 | Smart | 118/718 |
| 3,693,582 | 9/1972 | Delcour et al. | 118/718 |
| 3,819,097 | 6/1974 | Stritzko | 226/39 |
| 3,930,487 | 1/1976 | Gugel | 226/199 X |
| 4,674,443 | 6/1987 | Furukawa et al. | 118/718 X |
| 4,763,601 | 8/1988 | Saida et al. | 118/718 |
| 5,000,114 | 3/1991 | Yanagi et al. | 118/718 X |
| 5,016,561 | 5/1991 | Tokai et al. | 118/718 |
| 5,192,585 | 3/1993 | Inokuti et al. | 118/713 X |
| 5,317,358 | 5/1994 | Kawada | 226/199 X |

FOREIGN PATENT DOCUMENTS 288360  3/1991  Germany .............................. 242/615.3

*Primary Examiner*—C. D. Crowder
*Assistant Examiner*—Tina R. Taylor
*Attorney, Agent, or Firm*—Diller, Ramik & Wight, PC

[57] ABSTRACT

A material transfer device for continuously feeding or outputting strand material into or out of a treatment room, as well as to a material transfer structure. In order to maintain a desired treatment atmosphere in the treatment room, a material transfer device which is free from wear and trouble and has a good sealing effect. The material transfer device has a passage element, an inlet opening of which has a variable cross-section. The cross-section is either varied by a pressure device or by internal forces in a circumferentially expansible tube. Further, a pulling device pulls the strand material through the passage element. A plurality of chambers are arranged one behind the other, through which chambers the strand material travels both towards and out from the treatment chamber. The material passages of the chambers each have locks.

13 Claims, 3 Drawing Sheets

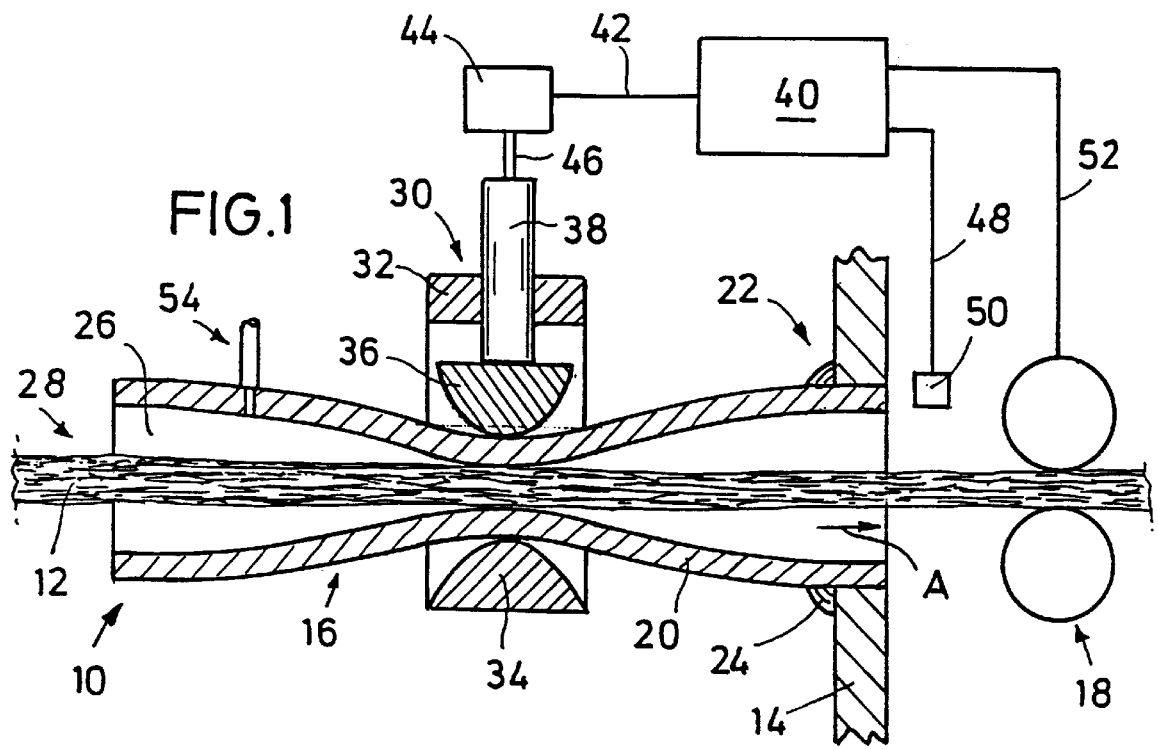
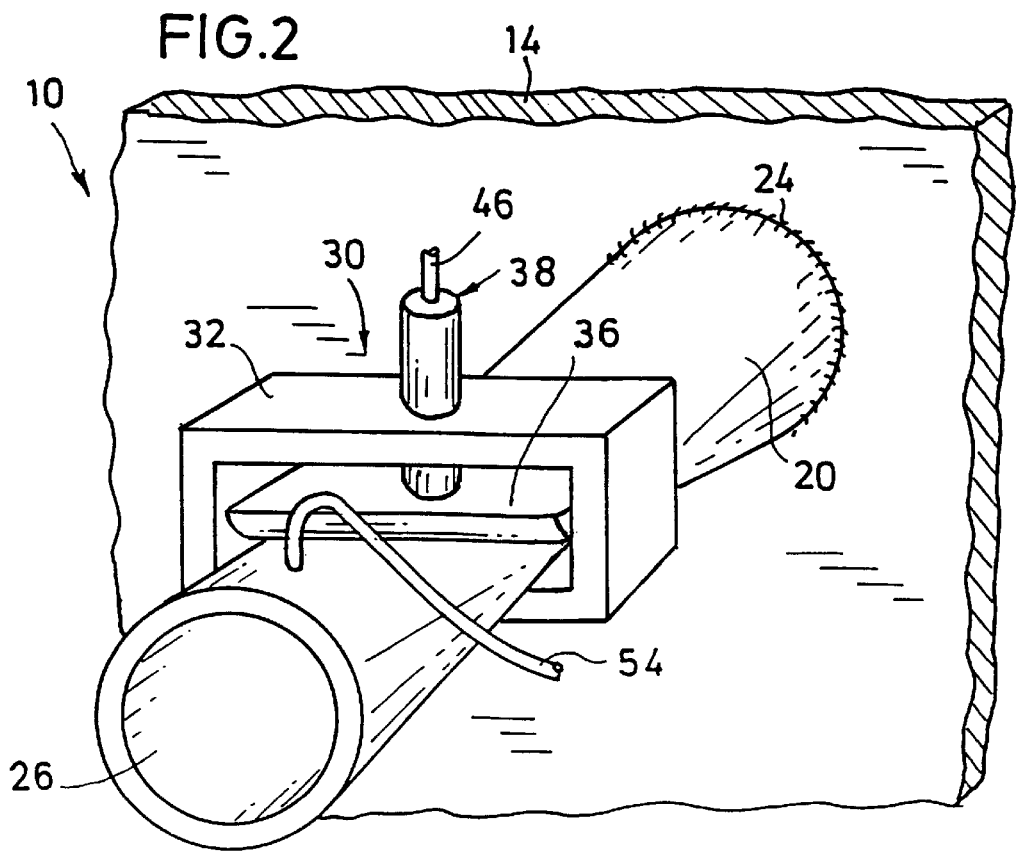

ROPE MATERIAL TRANSFER STRUCTURE

BACKGROUND OF THE INVENTION

The present invention relates to a material transfer device and a material transfer device structure for continuously feeding and/or yielding strand or rope material into or out of a closed treatment room in which a treatment atmosphere prevails.

Strand materials, e.g. irregular fiber bundles such as sliver of natural wool or regular fiber knits and fibre plaits, e.g. technical textiles, are used in many industries as raw materials and intermediate products. In order to prepare such strand materials for a subsequent treatment step, often chemical and physical treatment methods are employed with which the surface of the strand material is modified.

Chemical treatment methods often use hot, aggressive agents that form a treatment atmosphere in which the strand material will be treated. This treatment atmosphere is usually produced in a treatment room or a reactor into which the strand material is introduced prior to the treatment thereof.

In physical treatment methods, in particular in plasma treatment, a diluted gas atmosphere with a pressure in the range of a high vacuum is generated in a treatment room. In such a gas atmosphere, a plasma may be ignited by which the strand material may be modified.

If a reactor designed for intermittent operation is used in one of the treatment methods mentioned above, only a defined amount of strand material can be processed as the batch per operation cycle. For each batch, the atmosphere in the treatment room has to be adjusted anew.

For a continuous treatment of strand materials, plasma reactors have been developed as experimental plants comprising a reactor room through which the strand material is fed continuously. The strand material is introduced into the treatment room through an entry passage and put through an exit passage. Here, the entry and exit passages are mere openings in the wall or an arrangement of successive openings in the wall of the treatment room, which is why they have poor sealing qualities.

SUMMARY OF THE INVENTION

It is the object of the present invention to provide a material transfer device and a material transfer structure for continuously feeding and/or outputting strand material into or out of a closed treatment room in which a treatment atmosphere prevails, the material transfer device operating without wear and troublefree and providing for a good sealing of the treatment room.

The material transfer device of the present invention comprises a tubular passage element, the cross-section of which may be changed by deforming, wherein the term material transfer device as used here refers to a passage for strand material through which no substantial amounts of gas are taken along so that different gas pressures and gas atmospheres can prevail on both sides of a lock. Different opening cross-sections may be adjusted by means of an adjustable pressure device supporting the passage element, for example a flexible or elastic tube, at its outer surface. An inlet channel is formed on the inside of the elastic tube, through which the strand material is transported. The elongate gap between the tube and the strand material already provides a sealing effect. Using the adjustable pressure device that compresses the elastic tube, the gap between the strand material and the tube wall is adjusted, wherein wear-resistant sliding surfaces formed on the elastic tube allow for minimizing the passage of gas through the passage element. Moreover, the material transfer device has a pulling device with which the strand material is pulled through the inlet opening of the connecting element. The pulling device, arranged downstream of the passage element when viewed in the transport direction of the strand material, provides for a reliable transport of the strand material through the passage element, even if the strand material is in contact with the entire wall of the passage element. This structure of the material transfer device makes it possible to introduce, above all, irregular fiber strands or textiles into a treatment room while sealing off the outer atmosphere. However, this material transfer device can also be used for wire material.

The inner surface of the elastic tube has neither edges nor a gap, which makes it particularly suitable to receive fibrous material. Round tubes are especially suitable. A tube having a circular cross-section when unstressed and having a fixed length in the circumferential direction, is advantageous in that even slight deformations caused by an externally applied pressure force may entail a great relative constriction of the cross-section.

The pressure device may have a mechanically operated pusher. Such a mechanically operated pusher may be fixedly adjusted for stationary operation or it may exert a variable pressure through a spring element. It is further possible to provide a mechanically operated pusher with an adjusting element actuated by means of an electromotor, the element exerting a pressure depending on the actual quality of the strand material.

It is an advantage of a pressure means with a hydraulically or pneumatically operated pressure cylinder that high pressure may be exerted, while at the same time, depending on the structure of the pressure cylinder, a fast response to control pulses is given. Using a flexible sleeve enclosing the flexible tube at least over a pert thereof and being filled with a fluid connected to a pressure generating means, it becomes possible to obtain a good enclosure of, in particular, very irregular strand materials, for example sliver of wool, when employing a flexible tube.

For controlling the pressure device, the material transfer device may be provided with a controlling device which controls pressure device depending on the tensile stress in the strand material so that the tensile stress in the material transfer device remains as constant as possible.

Preferably, the control device comprises a surface sensor and a tensile force sensor. The surface sensor may be used to determine the cross-sectional area of the strand material leaving the connecting member and the tensile force sensor serves to determine the tensile force exerted on the strand material. From the tensile force determined and the calculated cross-sectional area, one may determine the tensile stress in the strand material so that the pressure device may be controlled such that a constant tension is maintained between the flexible tube and the pulling device. Thus, it becomes possible to enclose the strand material so tightly that it may just be pulled through the flexible tube without breaking. Thereby, the exchange of gas is minimized. Moreover, It is achieved that the strand material transported into the treatment room is introduced into the treatment room with a defined retardation.

In another embodiment, the cross-section of the inlet opening of the passage element is effected by the strand material which expands the passage element, if need be. When the passage element is a tube of a self-restoring material so that the passage element will contract, any kind of strand material may be passed through the material transfer device, it being made sure all the time that the passage element contacts the strand material. Preferably, the passage element is an elastomeric tube of a wear-resistant plastics material or a plastics material with a wear-resistant coating. This embodiment of the material transfer device is also fixedly arranged on the receptacle wall of a reactor or a treatment room and provided with a control device controlling the pulling means depending on the tensile stresses in the strand material.

In a preferred development of the present material transfer device, which is a material transfer structure for continuously feeding and outputting strand material into and out of a treatment room, at least one chamber is provided through which the strand material travels both to the treatment room and back therefrom. Here, the material passages of the chamber or the chambers are each provided with locks for the material feed and the materials return.

Providing the material inlet and the material outlet in one chamber is particularly advantageous when generating a vacuum in the treatment room. When the inlet portion is separated from the outlet portion, a vacuum pump is required in each portion, respectively. By providing the feeding and outputting of the strand material in one chamber, only a single vacuum pump is required.

If, for example, wool is processed in the present material transfer structure as the strand material, the surface area of the wool increases due to the treatment in the treatment room. Therefore, the surface area of the strand material to be output is larger than that of the strand material fed in. Due to this increase in surface area, the strand material to be output, which, after having passed the lock, comes from a portion with a stronger vacuum into a portion with a weaker vacuum, serves as a getter, i.e. the output strand material creates a pump effect. Since this pump effect supports the generation of the vacuum in the chamber, the efficiency of the chamber is improved.

To be able to generate a strong vacuum in the treatment chamber, several chambers have to be arranged in succession, in which chambers the vacuum is increased stepwise in the direction of the treatment room. For feeding and outputting, the strand material is passed through each chamber so that the pump effect occurs in each chamber.

Preferably, each chamber is provided with a pulling device for feeding and a pulling device for yielding the strand material, the devices being driven synchronously. Due to the spatial combination of the feeding and the outputting of strand material, the pulling devices my be driven by a single motor. Depending on the size of the chamber and on the strand material to be transported, a smaller number of pulling devices may suffice.

Further advantageous embodiments and developments of the present invention will become evident from the dependent claims and form the drawings taken in conjunction with the specification that refers to preferred embodiments.

BRIEF DESCRIPTION OF THE DRAWINGS

FIG. 1 is a schematic illustration of a first embodiment of a material transfer device according to the present invention in longitudinal section, FIG. 2 is a perspective view of the material transfer device.

DESCRIPTION OF THE PREFERRED EMBODIMENTS

Figure 3:
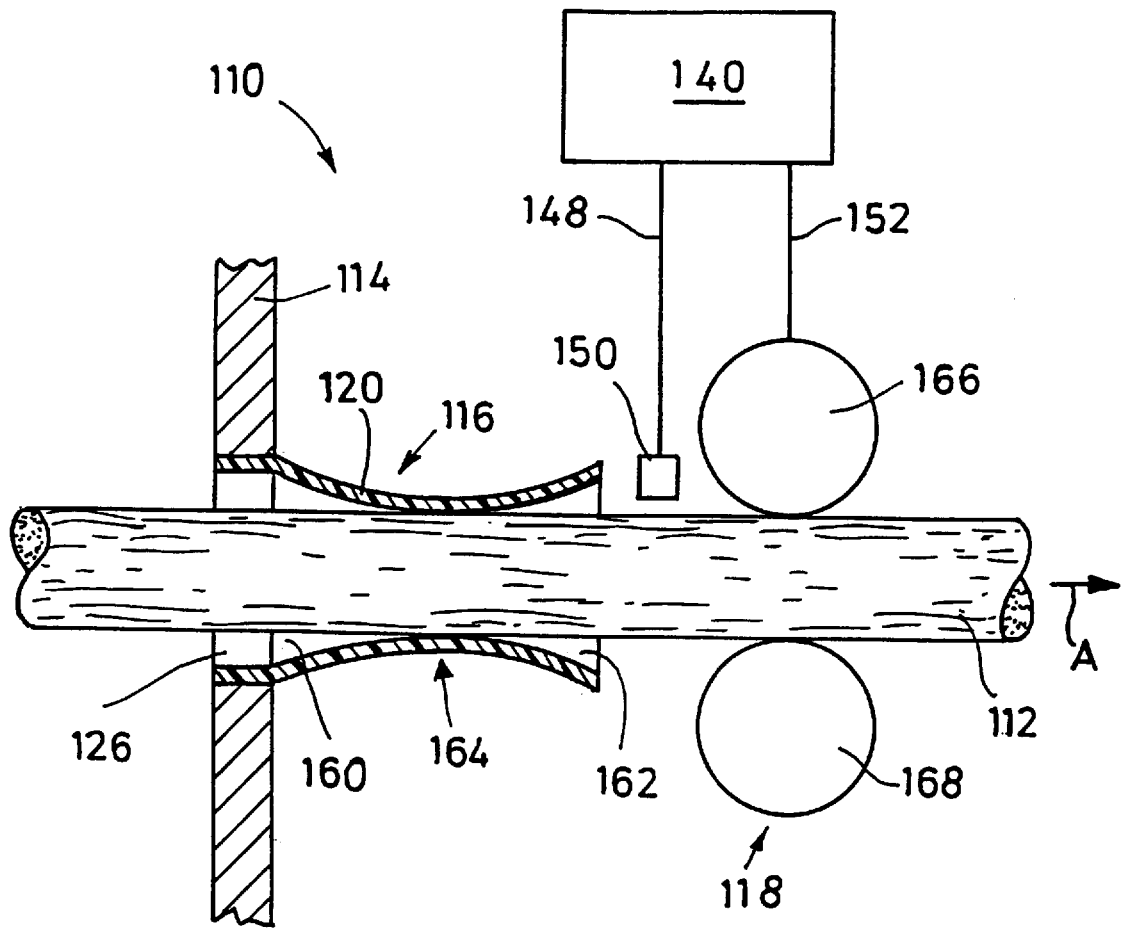
FIG. 3 is a schematic illustration of a second embodiment of a material transfer device according to the present invention in longitudinal section.

The material transfer device 10 of FIG. 1 is designed as an inlet lock for a fibrous strand material 12 transported through a pressure-resistant and gas-tight receptacle wall 14 into the interior of a plasma reactor. The material transfer device 10 has a passage element 16 connected with the receptacle wall 14, through which passage element the strand material 12 is drawn into the plasma reactor by means of a pulling device 18 arranged therein. The transport direction of the strand material 12 is indicated by the arrow A.

The passage element 16 is a flexible tube 20 of wear-resistant material with a circular cross-section when unloaded, a first end 22 of the tube facing the treatment room of the plasma reactor being inserted into a circular opening in the receptacle wall 14. The tube 20 is welded to the receptacle wall 14 with a continuous weld seam 24. Inside, the tube 20, as the inlet opening, defines an inlet channel open at the first end 22 of the tube 20 towards the treatment room of the plasma reactor and open at the second end 28 of the tube 20 to the atmosphere.

The cross-section of the opening of the inlet opening 26 may be adjusted by means of a pressure device 30 comprising a frame 32 with an abutment 34, through which frame the tube 20 projects. On the side of the frame 32 opposite the abutment 34, a pressure beam 36 is arranged guided in the frame 32 and actuatable by means of a hydraulic cylinder 38. The pressure beam 36 presses on the tube 20 such that the material tube 20 is flattened between the abutment 34 and the pressure beam 36. Since the circular cross-section of the tube 20 is larger at the second end 28 of the tube, at which the strand material 12 is fed in, than the cross-section of the strand material 12, the constriction of the cross-section of the tube 20 caused by the pressure device 30 creates a funnel-shaped configuration through which the strand material 12 is threaded, as it were. Since the wall of the tube 20 has neither edges nor a gap, the strand material 12 can be guided within the plasma reactor without a risk of getting caught at the material transfer device 10.

In order to obtain a perfect adjustment of the opening cross-section of the passage element 16 to the strand material 12, a control device 40 is provided which controls a pressure source 44 via a control line 42, the source supplying hydraulic oil to the hydraulic cylinder 38 via a pressure medium line 46. Through a first sensor line 48, the control device 40 is connected to an optical surface sensor 50 detecting the cross-sectional surface area of the strand material 12 leaving the flexible tube 20. A tensile force sensor detects the tensile force exerted on the strand material 12 by the pulling device 18 and transmits the value of the tensile force to the control device 40 via a second sensor line 52. The control device 40 calculates the tensile stress present in the strand material 12 from the cross-sectional surface area of the strand material 12 and the tensile force. For a perfect sealing, the control device 40 compares the calculated tensile stress to a limit value for the tensile stress. As long as the tensile stress is lower than the calculated limit value, a signal is outputted to the pressure source 44 via the control line 42 so that the pressure device 30 presses the pressure beam onto the tube 20. When the limit value for the tensile force is exceeded, a signal is outputted to retract the pressure beam 36.

To prevent unwanted foreign matter from entering the plasma reactor, the connector element 16 is provided with a gas inlet device 54 through which a reactive or inert gas corresponding to the atmosphere in the reactor chamber of the plasma reactor may be introduced into the inlet opening 26. The gas introduced through the gas inlet device 54 displaces the air entrained by the strand material, thereby contributing to the maintenance of the desired atmosphere composition in the plasm reactor.

The material transfer device 110 according to the second embodiment illustrated in FIG. 3 differs form the material transfer device 10 shown in FIGS. 1 and 2 only in the design of the passage element 116 and the design of the control device 140. Thus, corresponding parts are designated by reference numerals increased by 100.

In the second embodiment, the passage element 116 is an elastomeric tube 120 that is inserted into an opening in a receptacle wall 114. The elastomeric tube 120 has a nozzle-like tapered shape with a kind of inlet funnel 160 and a kind of outlet funnel 162, a contact portion 164 being formed between the inlet funnel 160 and the outlet funnel 164, in which contact portion the passage element 116 abuts the strand material 112.

The strand material 112 is pulled through the inlet opening 126 of the passage element 116 using a pulling device 118 comprising two transport rolls 166, 168 driven by one drive motor. In order to monitor the tensile stress in the strand material 112, a surface sensor 150 is provided, as in the first embodiment, which is connected to a control device 140 through a first control line 148. The force transmitted from the drive motor via the rolls 166, 168 onto the strand material 112 is detected in the pulling device 118 and transmitted to the control device 140 via a second control line 152. From the data transmitted to the control device 140, the control device 140 calculates the tensile stress present in the strand material 112. Subsequently, the drive motor of the pulling device 118 is sped up or slowed down by the control device 140 depending on the tensile stress determined.

If irregular material, such as sliver of wool, is pulled through the material transfer device 110 according to the second embodiment, the passage element 116 will expand when thick portions or knots are pulled through. When thin strand portions are transported through the material transfer device 110, the passage element 116 will contract due to internal tensions in the contact portion 164, whereby it will contact the strand material 112 also in this case. Should the passage element be disposed outside a treatment room and a higher pressure prevail on the outside of the treatment room than on the inside thereof, the passage element is compressed by the surrounding pressure without inner forces in the passage element.

To obtain a particularly good sealing, several material transfer devices could be arranged successively in a receptacle wall.

Figure 4:
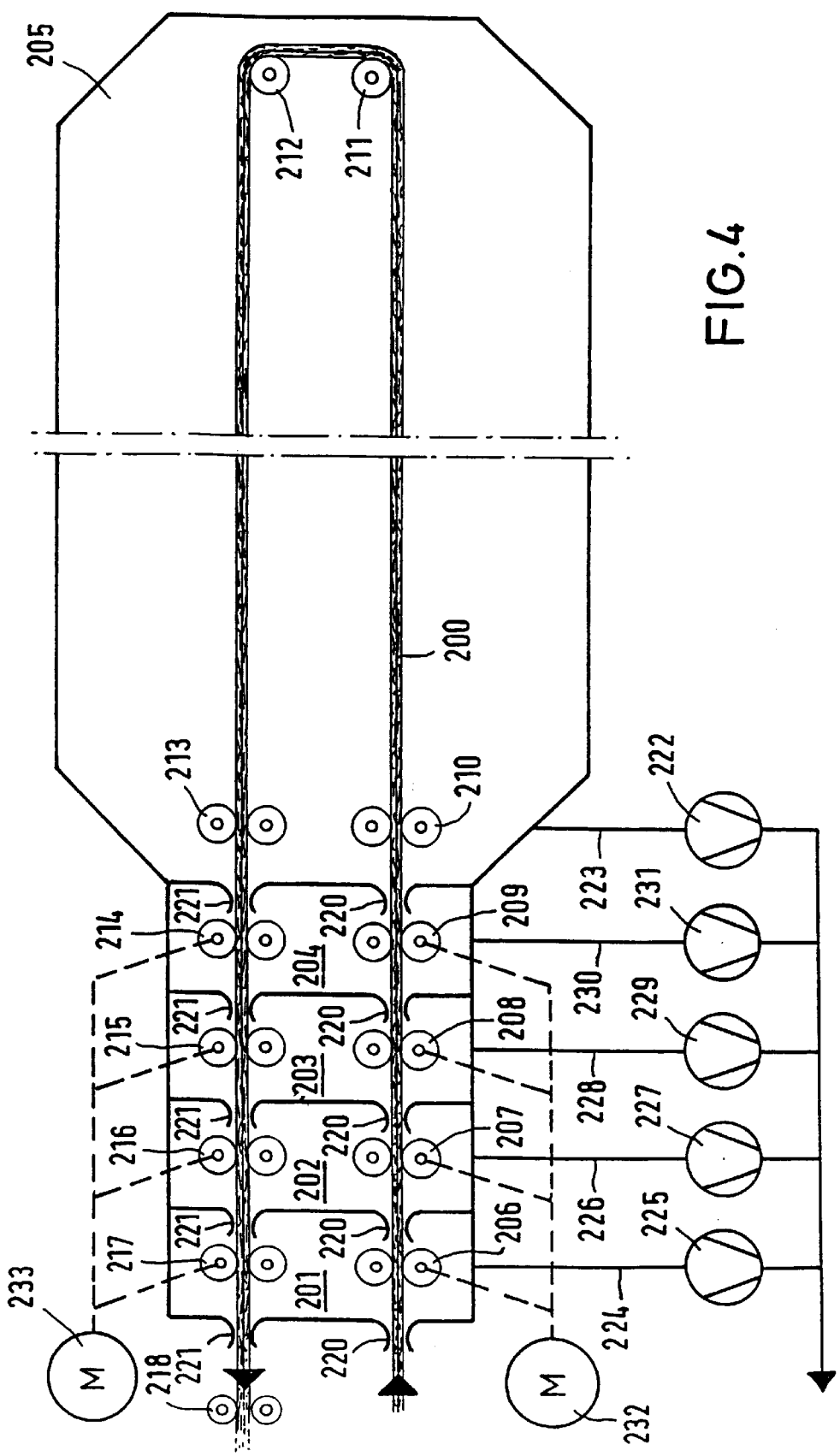
FIG. 4 is a schematic illustration of a material transfer structure according to the present invention in longitudinal section.

In the material transfer structure of FIG. 4, a strand material 200 is transported through a plurality of chambers 201–204 into a treatment room 205. For introducing the strand material 200 into the treatment room 205, each chamber 201–204 is provided with a pulling device 206–209 and the treatment room 205 includes pulling devices 210 and 213. The pulling devices 206–210 transport the strand material 200 to the right hand side in FIG. 4 through the treatment chamber 205 to a guide roller 211. From a further guide roller 212, the strand material 200 is deflected into the opposite direction so that it is transported to the left hand side in FIG. 4 by the pulling device 213. Downstream of the pulling device 213, seen in the transport direction, the strand material 200 passes through the chambers 201–204 in the opposite direction. To this avail, each chamber 201–204 is provided with a further pulling device 214–217. For transporting the strand material 200 out from the chamber 201, a further pulling device 218 is arranged outside the chamber 201.

Moreover, each chamber 201–204 has locks 220 for the material feed and locks 221 for the material return.

In order to create a strong vacuum in the treatment chamber 205, using a vacuum pump 222 connected to the treatment chamber 205 via a line 223, the vacuum in the chambers 201–204 is increased stepwise. Thus, the chamber 201 is connected to a vacuum pump 225 through a line 224. The neighboring chamber 202 is connected to a vacuum pump 227 via a line 226, the pump creating a vacuum in the chamber 202 that is higher than that generated in the chamber 201. Correspondingly, a stronger vacuum than that in chamber 202 is generated in the chamber 203 by means of a vacuum pump 229 connected via a line 228. Similarly, the vacuum created in the chamber 204 by a vacuum pump 231 connected with the chamber 204 through a line 230 is higher than the vacuum in the chamber 203.

The pulling devices 206–209 are driven synchronously by a motor 232. The pulling devices 214–217 fro bringing out the strand material 200 are driven by a motor 233. The pulling devices 210 and 213 provided in the treatment room 205, as well as further pulling devices not shown may also be driven by motors. The number of the pulling devices may be reduced substantially, in particular for strand materials with high tensile strength.

Although preferred embodiments of the invention have been specifically illustrated and described herein, it is to be understood that minor variations may be made in the material transfer device without departing from the spirit and scope of the invention as defined in the appended claims.

I claim:

1. A rope material transfer structure comprising a closed treatment room (205) in which a treatment atmosphere prevails, pulling devices (206–210, 213–218) by which rope material (200) is pulled through said treatment room (205), at least one chamber (201) through which rope material (200) travels both towards said treatment room (205) and away from said treatment room (205) through passages having locks (220, 221), said locks (220, 221) being elastic tubular passage elements (16, 116) through which the rope material (210) is pulled, and said elastic tubular passage elements (16, 116) being variable in cross-section through deformation into substantial sealing relationship with the rope material (200).

2. The rope material transfer structure as defined in claim 1 including further chambers (202–204) arranged one behind the other and having passages and locks through which the rope material is pulled both toward and away from said treatment room.

3. The rope material transfer structure as defined in claim 1 wherein said pulling devices (206, 217) are located in said one chamber.

4. The rope material transfer structure as defined in claim 1 wherein said pulling devices (206, 217) are located in said one chamber, and means (M) for synchronously driving said pulling devices.

5. The rope material transfer structure as defined in claim 1 wherein said elastic tubular passage elements are normally of a substantially circular cross-sectional configuration.

6. The rope material transfer structure as defined in claim 1 including means (30) for varying the cross-sectional deformation of said passage elements.

7. The rope material transfer structure as defined in claim 1 including means (30) for varying the cross-sectional deformation of said passage elements in response to sensing means (50 or 52) responsive to rope material characteristics.

8. The rope material transfer structure as defined in claim 1 including adjustable pressure means (30) for varying the cross-sectional deformation of said passage elements.

9. The rope material transfer structure as defined in claim 1 including mechanically adjustable pressure means (30) for varying the cross-sectional deformation of said passage elements.

10. The rope material transfer structure as defined in claim 1 including means (30) for varying the cross-sectional deformation of said passage elements, and said varying means (30) includes a sleeve in exterior surrounding relationship to each passage element.

11. The rope material transfer structure as defined in claim 1 wherein said elastic tubular passage elements each include a funnel-shaped portion.

12. The rope material transfer structure as defined in claim 1 wherein said elastic tubular passage elements each include opposite entrance and exit funnel-shaped portions.

13. The rope material transfer structure as defined in claim 1 including means for creating at least a partial vacuum in said treatment room (205), a gas atmosphere within said treatment room, and means (54) for introducing a gas into each passage element to prevent unwanted foreign matter from entering the treatment room.

* * * * *